(12) United States Patent
Kim (10) Patent No.: US 8,310,153 B2
(45) Date of Patent: Nov. 13, 2012

(54) ORGANIC LIGHT EMITTING DIODE DISPLAY DEVICE AND METHOD OF FABRICATING THE SAME

(75) Inventor: Hun Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 99 days.

(21) Appl. No.: 12/603,415

(22) Filed: Oct. 21, 2009

(65) Prior Publication Data
US 2010/0096984 A1   Apr. 22, 2010

(30) Foreign Application Priority Data
Oct. 22, 2008   (KR) .................. 10-2008-0103832

(51) Int. Cl.
*H01J 1/62* (2006.01)
*H01J 63/04* (2006.01)

(52) U.S. Cl. ........ 313/512; 313/483; 313/500; 313/501; 313/502; 313/503; 313/504; 313/505; 313/506

(58) Field of Classification Search .................. None
See application file for complete search history.

(56) References Cited

U.S. PATENT DOCUMENTS
6,897,087 B2   5/2005   Yanagawa et al.

FOREIGN PATENT DOCUMENTS

| | | |
|---|---|---|
| JP | 07-272857 | 10/1995 |
| JP | 2002-280169 | 9/2002 |
| JP | 2004-022176 (A) | 1/2004 |
| JP | 2004-095551 (A) | 3/2004 |
| JP | 2006-100186 | 4/2006 |
| JP | 2006-252857 | 9/2006 |
| JP | 2007-115692 (A) | 5/2007 |
| KR | 10-2004-0004148 | 1/2004 |
| KR | 10-2007-0078502 | 8/2007 |
| WO | WO 2005050751 A2 * | 6/2005 |

OTHER PUBLICATIONS

Chinese Office Action dated Jan. 17, 2011 for Chinese Patent Application No. CN 200910174069.5 corresponding to Korean Patent Application No. KR 10-2008-0103832 which corresponds to the captioned application.
Japanese Office Action dated Jul. 19, 2011 for Japanese Patent Application No. JP 2009-243283 which shares priority of Korean Patent Application No. KR 10-2008-0103832 with captioned U.S. Appl. No. 12/603,415.
Japanese Office Action dated Nov. 8, 2011 for Japanese Patent Application No. JP 2009-243283 which shares priority of Korean Patent Application No. KR 10-2008-0103832 with captioned U.S. Appl. No. 12/603,415.

\* cited by examiner

*Primary Examiner* — Natalie Walford
(74) *Attorney, Agent, or Firm* — Knobbe, Martens, Olson & Bear LLP (57) ABSTRACT

An organic light emitting diode display device and a method of fabricating the same are disclosed. In one embodiment, the organic light emitting diode display device includes i) a base substrate including a first device region and a first encapsulation region, ii) an organic light emitting diode (OLED) disposed on the first device region, iii) an inner filler formed over the OLED and the first device region, iv) a light transmission layer formed on the inner filler, v) an encapsulation substrate including a second device region and a second encapsulation region corresponding to the first device region and first encapsulation region, respectively, wherein the second device region is formed over the light transmission layer and vi) an encapsulation agent disposed on the first and second encapsulation regions, and configured to encapsulate the base substrate with the encapsulation substrate.

12 Claims, 4 Drawing Sheets

ORGANIC LIGHT EMITTING DIODE DISPLAY DEVICE AND METHOD OF FABRICATING THE SAME

CROSS-REFERENCE TO RELATED APPLICATION

This application claims the benefit of Korean Patent Application No. 2008-103832, filed Oct. 22, 2008, the disclosure of which is hereby incorporated herein by reference in its entirety.

BACKGROUND OF THE INVENTION

1. Field of the Invention

The present invention relates to an organic light emitting diode (OLED) display device and a method of fabricating the same, and more particularly, to an organic light emitting diode (OLED) display device capable of supplementing the poor mechanical strength caused by encapsulating a substrate and an encapsulation substrate using a glass frit and preventing a decrease in emission efficiency according to brightness, and a method of fabricating the same.

2. Description of the Related Technology

In the recent time, flat panel display devices such as liquid crystal display (LCD) devices, OLED display devices or plasma display panels (PDPs) solving disadvantages of conventional display devices such as cathode ray tubes have been attracted attentions.

SUMMARY OF CERTAIN INVENTIVE ASPECTS

One aspect of the present invention is an organic light emitting diode (OLED) display device capable of supplementing the mechanical strength of a glass frit, and a method of fabricating the same.

Another aspect of the present invention is an organic light emitting diode (OLED) display device supplementing the mechanical strength and preventing a decrease in emission efficiency according to brightness, and a method of fabricating the same.

Another aspect of the present invention is an OLED display device, which includes: a substrate including a device region and an encapsulation region; an organic light emitting diode disposed on the device region of the substrate; an encapsulation substrate including a device region and an encapsulation region corresponding to the substrate; a light transmission layer formed on the device region of the encapsulation substrate; an inner filler formed on the device region of the encapsulation substrate and formed on the light transmission layer; and an encapsulation agent disposed on the encapsulation region of the encapsulation substrate, and configured to encapsulate the substrate with the encapsulation substrate.

The device may further include a protection layer surrounding the organic light emitting diode.

The device may further include a sealant portion disposed on the encapsulation region of the encapsulation substrate, and supporting the inner filler.

The encapsulation agent may be disposed outside the sealant portion.

The encapsulation agent may be a glass frit, and include one selected from the group consisting of lead oxide (PbO), diboron trioxide ($B_2O_3$) and silicon dioxide ($SiO_2$).

The light transmission layer may have a refractive index ranging from 1.75 to 1.85, and may be formed to a thickness ranging from 630 to 770 Å.

Another aspect of the present invention is a method of fabricating an OLED display device, which includes: providing a substrate including a device region and an encapsulation region; forming an organic light emitting diode on the device region of the substrate; providing an encapsulation substrate including a device region and an encapsulation region corresponding to the substrate; forming a light transmission layer on the device region of the encapsulation substrate; forming an inner filler on the device region of the encapsulation substrate, and on the light transmission layer; and forming an encapsulation agent on the encapsulation region of the encapsulation substrate to encapsulate the substrate with the encapsulation substrate.

The method may further include forming a sealant portion on the encapsulation region of the encapsulation substrate after forming the light transmission layer.

The method may further include forming a protection layer surrounding the organic light emitting diode after forming the organic light emitting diode.

The encapsulation agent may be a glass frit, to which laser is applied to melt and solidify.

Here, the light transmission layer may have a refractive index ranging from 1.75 to 1.85, and may be formed to a thickness ranging from 630 to 770 Å. Another aspect of the invention is an organic light emitting diode (OLED) display device, comprising: a base substrate including a first device region and a first encapsulation region, wherein the first encapsulation region is located on opposing sides of the first device region; an organic light emitting diode (OLED) disposed on the first device region; an inner filler formed over the OLED and the first device region; a light transmission layer formed on the inner filler; an encapsulation substrate including a second device region and a second encapsulation region corresponding to the first device region and first encapsulation region, respectively, wherein the second device region is formed over the light transmission layer; and an encapsulation agent disposed on the first and second encapsulation regions, and configured to encapsulate the base substrate with the encapsulation substrate.

The device further comprises a protection layer formed between the OLED and inner filler and surrounding the OLED. The device further comprises a sealant portion disposed on the first and second encapsulation regions, and configured to support the inner filler. In the device, the encapsulation agent is disposed outside the sealant portion. In the device, the encapsulation agent is a glass frit. In the device, the glass frit includes one selected from the group consisting of lead oxide (PbO), diboron trioxide ($B_2O_3$) and silicon dioxide ($SiO_2$). In the device, the light transmission layer is formed of an organic layer, an inorganic layer or a combination thereof. In the device, the light transmission layer has a refractive index ranging from about 1.75 to about 1.85.

In the device, the light transmission layer has a thickness ranging from about 630 Å to about 770 Å. In the device, the inner filler includes at least one selected from the group consisting of acrylic resin, epoxy-based resin, fluorine resin and tefron resin. In the device, the sealant portion includes at least one selected from the group consisting of silicon-based resin, epoxy-based resin, acrylic resin and polyimide-based resin. In the device, the OLED further includes a thin film transistor having a semiconductor layer, a gate electrode and source and drain electrodes.

Another aspect of the invention is a method of fabricating an organic light emitting diode (OLED) display device, comprising: providing a base substrate including a first device region and a first encapsulation region, wherein the first encapsulation region is located on both sides of the first device region; forming an organic light emitting diode (OLED) on the first device region, wherein the base substrate and OLED together form a lower section of the OLED display device; providing an encapsulation substrate including a second device region and a second encapsulation region corresponding to the first device region and first encapsulation region, respectively; forming a light transmission layer on the second device region; forming an inner filler on the second device region, wherein the encapsulation substrate, light transmission layer and inner filler together form an upper section of the OLED display device; placing the upper section on the lower section so that the inner filler is formed over the OLED, wherein the inner filler is closer to the OLED than the encapsulation substrate; providing an encapsulation agent on the first and second encapsulation regions; and encapsulating the base substrate with the encapsulation substrate via the encapsulation agent.

The method further comprises forming a protection layer surrounding the OLED subsequent to forming the OLED. The method further comprises forming a sealant portion on the second encapsulation region subsequent to forming the light transmission layer. In the method, providing the encapsulation agent comprises disposing the encapsulation agent outside the sealant portion. In the method, the encapsulation agent is a glass frit, and wherein the encapsulating comprises applying laser light to the glass frit to melt and solidify the glass frit.

Still another aspect of the invention is an organic light emitting diode display device, comprising: a base substrate including a first device region and a first encapsulation region, wherein the first encapsulation region is located on both sides of the first device region; an organic light emitting diode (OLED) disposed on the first device region; an encapsulation substrate including a second device region and a second encapsulation region corresponding to the first device region and first encapsulation region, respectively, wherein the second device region is formed over the OLED; a support structure contacting the OLED and the second device region; and an encapsulation agent disposed on the first and second encapsulation regions, and configured to encapsulate the base substrate with the encapsulation substrate.

In the device, the support structure comprises an inner filler formed over the OLED and the first device region; and a light transmission layer formed on the inner filler. In the device, the support structure further comprises a protection layer formed between the OLED and inner filler and surrounding the OLED.

BRIEF DESCRIPTION OF THE DRAWINGS

These and/or other aspects of the invention will become apparent and more readily appreciated from the following description of the embodiments, taken in conjunction with the accompanying drawings.

DETAILED DESCRIPTION OF EXEMPLARY EMBODIMENTS

LCD devices are non-emissive devices, not self-emissive devices, so that they have limitations in brightness, contrast, viewing angle and large size. PDPs are self-emissive devices, but they are heavy, have high power consumption and fabricated by a complicated process compared to other flat panel display devices.

OLED display devices are self-emissive devices, which have excellent viewing angle and contrast. In addition, since they do not need back light, they can be formed lightweight and slim, and have lower power consumption. They can also be operated at direct current and low voltage, and have a rapid response speed. Moreover, since they are solid, they are strong against external impact, used in a wide range of temperatures, and fabricated by a simple process and at a low cost.

Organic thin films formed of an organic compound with low heat resistance are easily degraded due to moisture, and negative electrodes formed on the organic thin layers are degraded in performances due to oxidation. Accordingly, OLED display devices should be encapsulated to prevent penetration of moisture or oxygen into the organic thin layers.

Figure 1:
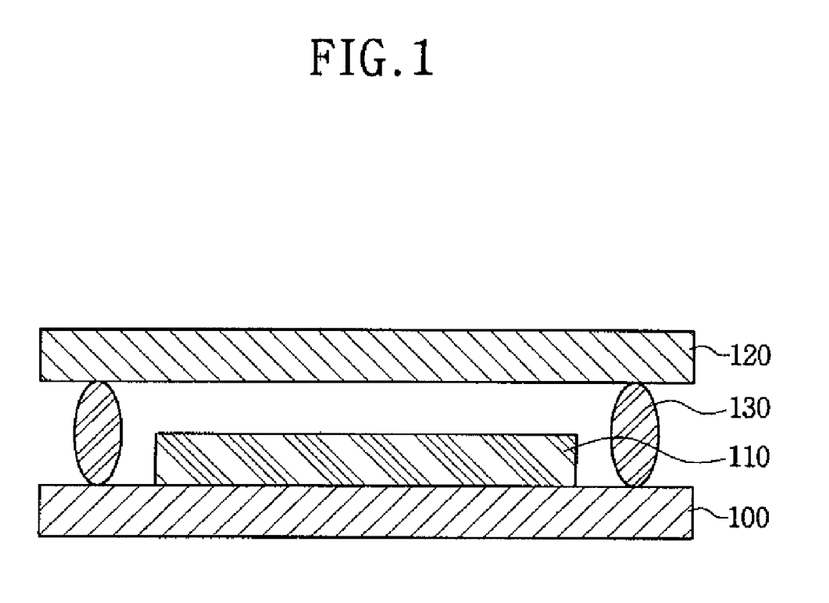
FIG. 1 is a cross-sectional view of an organic light emitting diode (OLED) display device.

FIG. 1 is a cross-sectional view of an organic light emitting diode (OLED) display device.

Referring to FIG. 1, a substrate 100 is provided, and an OLED 110 is formed on the substrate 100. The OLED 110 includes a first electrode, an organic layer having at least an emission layer, and a second electrode.

A thin film transistor having a semiconductor layer, a gate electrode and source and drain electrodes may be further included.

Subsequently, an encapsulation substrate 120 is provided, a glass frit 130 is formed on a surface of the substrate 100 or the encapsulation substrate 120, and then the substrate 100 is bonded to the encapsulation substrate 120.

Afterwards, the glass frit 130 is melted by irradiation of laser and then is solidified, and thus the OELD display device is completed.

While the glass frit may be good to prevent penetration of moisture or oxygen, it is poor in mechanical strength.

Embodiments of the present invention will be described with respect to the accompanying drawings, wherein like reference numerals refer to the like elements throughout.

FIGS. 2 to 7 are cross-sectional views illustrating a method of fabricating an organic light emitting diode (OLED) display device according to an exemplary embodiment of the present invention.

Figure 2:
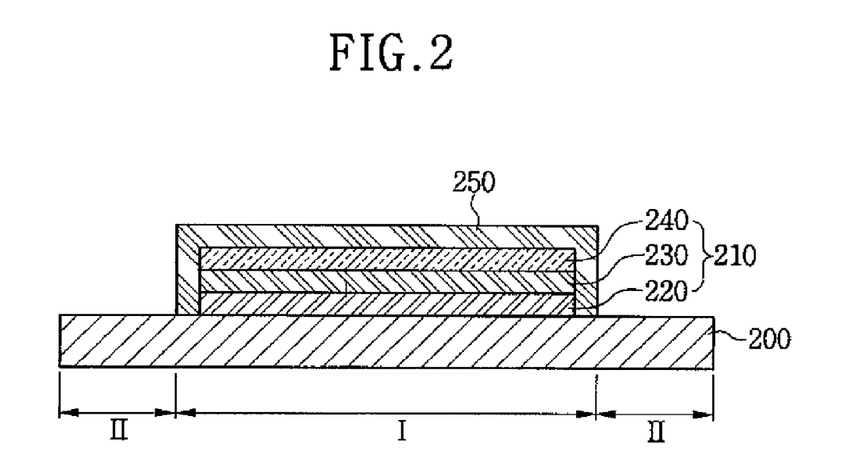
FIGS. 2 to 7 are cross-sectional views illustrating a method of fabricating an OLED display device according to an exemplary embodiment of the present invention.

Referring to FIG. 2, a substrate (or a base substrate) 200 including a device region (or a first device region) I and an encapsulation region (or a first encapsulation region) II is provided. The substrate 200 may be formed of insulating glass, plastic or conductive material.

Subsequently, an organic light emitting diode 210 is formed on the device region I of the substrate 200. The organic light emitting diode 210 includes a first electrode 220, an organic layer 230 having at least one emission layer, and a second electrode 240. The substrate 200 and the organic light emitting diode 210 may form a lower section (which may also include a protection layer 250) of the OLED display device (See FIG. 7).

In the organic light emitting diode 210, the first electrode 220 may be a reflective electrode. The reflective electrode may be formed by sequentially stacking a reflective layer formed of one selected from the group consisting of silver (Ag), magnesium (Mg), aluminum (Al), platinum (Pt), palladium (Pd), gold (Au), nickel (Ni), neodymium (Nd), iridium (Ir), chromium (Cr) and compounds thereof, and a transparent electrode formed of one selected from the group consisting of indium tin oxide (ITO), indium zinc oxide (IZO), tin oxide (TO) and zinc oxide (ZnO).

The first electrode 220 may be formed in a stacked structure of a lower electrode layer, a reflective electrode layer and an upper electrode layer.

The lower electrode layer may be formed of one selected from the group consisting of ITO, IZO, TO and ZnO. Here, the lower electrode layer is formed to a thickness ranging from about 50 Å to about 100 Å. Depending on circumstances or embodiments, the thickness of the lower electrode layer may be less than about 50 Å or greater than about 100 Å.

The reflective electrode layer may be formed of one selected from the group consisting of Al, an Al alloy, Ag and an Ag alloy, and formed to a thickness ranging from about 900 Å to about 2000 Å. Depending on circumstances or embodiments, the thickness of the reflective electrode layer may be less than about 900 Å or greater than about 2000 Å.

Here, the reflective electrode layer may reflect light, and thus increase brightness and emission efficiency.

The upper electrode layer may be formed of one selected from the group consisting of ITO, IZO, TO and ZnO. Here, the upper electrode layer is formed to a thickness ranging from about 50 Å to about 100 Å. Depending on circumstances or embodiments, the thickness of the upper electrode layer may be less than about 50 Å or greater than about 100 Å.

In the exemplary embodiment of the present invention, the OLED is a top-emission type. Thus, if the first electrode is appropriate for embodying a top-emission OLED, the material and stacked structure of the first electrode are not limited thereto.

The organic layer 230 includes at least an emission layer, and may further include at least one of a hole injection layer, a hole transport layer, an electron transport layer and an electron injection layer. However, the composition and material of the organic layer is not limited in the present invention.

A material for the hole transport layer may include N,N'-di(naphthalene-1-yl)-N,N'-diphenyl-benzidine, α-NPB, or N,N'-bis(3-methylphenyl)-N,N'-diphenyl-[1,1'-biphenyl]-4,4'-diamine (TPD). The hole transport layer may be formed to a thickness ranging from 10 to 50 nm. Beyond this range, the hole injection characteristics may be deteriorated.

For such a hole transport layer, a dopant capable of emitting light by an electron-hole combination may be further added, other than the hole transport material. The dopant may include 4-(dicyanomethylene)-2-t-butyl-6-(1,1,7,7-tetramethyljulolidyl-9-enyl)-4H-pyran (DCJTB), coumarin 6, rubrene, DCM, DCJTB, perylene and quinacridone. The dopant is contained at about 0.1 wt % to about 5 wt % with respect to the total content of the material for the hole transport layer. As the dopant is added for the hole transport layer, the color of the light emitted can be adjusted according to the kind and content of the dopant, and thermal stability of the hole transport layer can be improved, thereby extending the life span of the device.

The hole injection layer may be formed of a starbust amine-based compound, and may be formed to a thickness of about 30 nm to about 100 nm. Depending on circumstances or embodiments, the thickness of the hole injection layer may be less than about 30 nm or greater than about 100 nm. A contact resistance between a counter electrode and the hole transport layer may be reduced due to the hole injection layer, and hole transport ability of an anode electrode is enhanced, resulting in improving almost all characteristics of the device.

The material for the emission layer may be formed of 4,4'-bis(carbazole-9-yl)-biphenyl (CBP).

The emission layer may further contain a dopant capable of emitting light due to an electron-hole combination like the hole transport layer described above, and the kind and content of the dopant are almost the same as those for the hole transport layer. The emission layer may be formed to a thickness ranging from about 10 nm to about 40 nm.

A material for the electron transport layer may be formed of tris(8-quinolinolate)-aluminum (Alq3) or Almq3, and further contain a dopant capable of emitting light due to an electron-hole combination like the hole transport layer as described above. Here, the kind and content of the dopant may be almost the same as those for the hole transport layer, and the electron transport layer may be formed to a thickness ranging from about 30 nm to about 100 nm. Depending on circumstances or embodiments, the thickness of the electron transport layer may be less than about 30 nm or greater than about 100 nm.

A hole barrier layer (HBL) may be further formed between the emission layer and the electron transport layer. The hole barrier layer functions to prevent moving of an exciton formed from a phosphorescent emitting material to the electron transport layer, or prevent moving of a hole to the electron transport layer. The hole barrier layer may be formed of BAlq.

The electron injection layer may be formed to a thickness ranging from about 0.1 nm to about 10 nm using LiF. Depending on circumstances or embodiments, the thickness of the electron transport layer may be less than about 0.1 nm or greater than about 10 nm.

The second electrode 240 formed on the organic layer includes a semi-transmissive cathode or a stacked structure of a semi-transmissive cathode and a transmissive cathode. The semi-transmissive cathode may be formed of one selected from the group consisting of lithium (Li), calcium (Ca), LiF/Ca, LiF/Al, Al, Mg and an Mg alloy, and formed to a thickness ranging from about 5 nm to about 30 nm. The stacked structure may be formed by stacking a semi-transmissive cathode using one selected from the group consisting of metals with a low work function such as Li, Ca, LiF/Ca, LiF/Al, Al, Mg and an Mg alloy, and a layer formed of ITO or IZO with a low resistance characteristic. Depending on circumstances or embodiments, the thickness of the semi-transmissive cathode may be less than about 5 nm or greater than about 30 nm. The total thickness of the semi-transmissive cathode and the transmissive cathode may range from about 10 nm to about 400 nm.

Since the organic light emitting diode is a top-emission type, if the second electrode is appropriate for the embodiment of the top-emission OLED, the material and stacked structure of the second electrode are not limited to the examples.

Although not illustrated in the drawing, the organic light emitting diode 210 may further include a thin film transistor having a semiconductor layer, a gate electrode and source and drain electrodes.

The thin film transistor may be a top-gate thin film transistor in which a gate electrode is formed on a semiconductor layer, or a bottom-gate thin film transistor in which a gate electrode is formed under a semiconductor layer.

Subsequently, a protection layer 250 surrounding the organic light emitting diode 210 is formed.

The protection layer 250 may be formed of an organic layer, an inorganic layer or a combination thereof. The inorganic layer may be an insulating layer formed of, for example, silicon oxide ($SiO_2$), silicon nitride ($SiN_x$) or silicon oxynitride ($SiO_xN_y$). Alternatively, the inorganic layer may be formed of LiF. Meanwhile, the organic layer may be formed of N,N'-bis(naphthalene-1-yl)-N,N'-bis(phenyl)benzidine (NPB), TNATA, TCTA, TDAPB, TDATA, Alq3, BAlq or CBP.

The protection layer 250 may be formed by evaporation, CVD or sputtering. The protection layer 250 may protect the organic layer from external moisture or oxygen to prevent deterioration of the diode.

Here, the inorganic protection layer may be formed by sputtering, whereas the organic protection layer may be formed by evaporation or CVD.

However, when the protection layer is formed by sputtering, the OLED may be damaged. For this reason, the protection layer may be formed by evaporation or CVD to relatively less damage to the OLED, so that the protection layer may be an organic layer.

Since the OLED is a top-emission type, the protection layer may be a transparent protection layer whose refractive index may be higher than that of the second electrode. Here, when light emitted from the organic emission layer emits outside through the second electrode, total reflection occurring at an interface between the second electrode and the protection layer may be reduced, thereby increasing optical transmittance, and the refractive index may be adjusted, thereby obtaining optimal emission efficiency.

Here, the protection layer may have a refractive index of about 1.5 or more for the optimal emission efficiency, or may range from about 1.7 to about 1.9.

Figure 3:
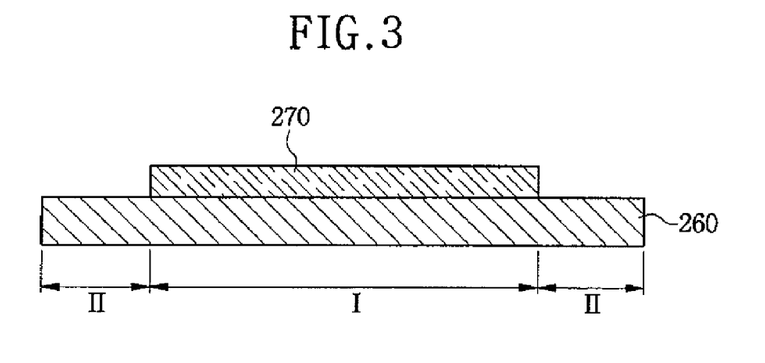

Referring to FIG. 3, corresponding to the above-described substrate 200 including the device region I and the encapsulation region II, an encapsulation substrate 260 including a device region (or a second device region) I and an encapsulation region (or a second encapsulation region) II is provided, and a light transmission layer 270 is formed in the device region I of the encapsulation substrate 260.

The encapsulation substrate 260 may be formed of insulting glass or plastic, and the light transmission layer 270 may be an organic layer, an inorganic layer, or a combination thereof. The inorganic layer may be formed of silicon oxide ($SiO_2$), silicon nitride (SiNx) or silicon oxynitride (SiOxNy). Alternatively, the inorganic layer may be formed of LiF. Meanwhile, the organic layer may be formed of NPB, TNATA, TCTA, TDAPB, TDATA, Alq3, BAlq, or CBP.

The light transmission layer 270 may be formed by evaporation, CVD or sputtering.

Here, the inorganic light transmission layer 270 may be formed by sputtering, whereas the organic light transmission layer 270 may be formed by evaporation or CVD.

However, unlike the protection layer 250 described above, even when the light transmission layer 270 is formed by sputtering, the OLED is not formed on an encapsulation substrate, and thus it does not get damaged. Thus, there is no limitation to the method of forming the light transmission layer.

It will be described in detail later but the light transmission layer 270 may have a predetermined refractive index for the optimal emission efficiency, and the light transmission layer 270 may have a refractive index ranging from about 1.75 to about 1.85.

Since the OLED is a top emission type, the thickness of the light transmission layer may range from about 630 Å to about 770 Å for the optimal transmittance, or may be about 700 Å.

Figure 4:
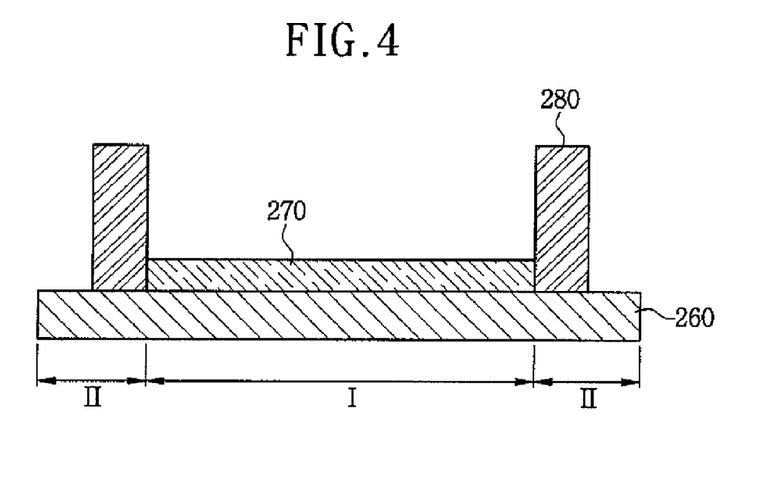

Subsequently, referring to FIG. 4, a sealant is formed on the encapsulation region II of the encapsulation substrate, and then heat or UV is applied to the sealant for curing, thereby forming a sealant portion 280.

Here, the sealant portion 280 may be formed of a UV-curable or thermostatic material. For example, it may be formed of silicon-based resin, epoxy-based resin, acrylic resin or polyimide-based resin, but the material for the sealant is not limited to the examples.

When the sealant portion 280 is formed of moisture-absorbing resin, it may absorb moisture penetrated inside, and improve a sealing effect. But the sealing portion may function as a partition wall supporting an inner filler to be described later.

Figure 5:
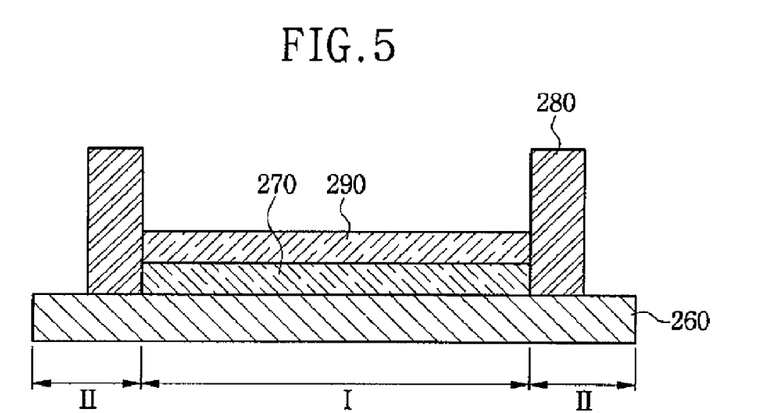

Subsequently, referring to FIG. 5, the sealant portion is formed on the encapsulation region II of the encapsulation substrate as a partition wall, and an inner filler 290 is formed on the device region I of the encapsulation substrate.

The inner filler 290 may be formed by deposition or coating, and as described above, the sealant portion may function as a partition wall when the inner filler is applied.

That is, according to a subsequent process, a glass fit is formed outside the inner filler. If there is no sealant portion functioning as a partition wall, the inner filler is also formed on a region where the glass frit is to be formed, thereby reducing adhesion between the glass frit and the encapsulation substrate. Moreover, the inner filler is contaminated due to a contact with the glass frit, thereby reducing the adhesion. In order to prevent the reduction of the adhesion, the sealant portion is formed.

As the substrate is encapsulated with the encapsulation substrate using the glass frit, the inner filler is provided to supplement the strength of the glass frit, which is good for preventing penetration of moisture or oxygen but very poor in mechanical strength. Thus, as the inner filler is formed between the encapsulation substrate and the substrate, the damage to the glass frit may be prevented from outer impact or pressure, and the damage to the OLED display device may also be prevented.

Here, the inner filler may be formed of at least one selected from the group consisting of acrylic resin, epoxy-based resin, fluorine resin and tefron resin.

However, the inner filler may be a material with a low refractive index to minimize a refractive index, but it still has a refractive index of less than about 1.5.

Here, as described above, while the top-emission OLED may exhibit the optimal emission efficiency by adjusting the refractive index of the protection layer 250, the optimal emission efficiency may not be exhibited due to the inner filler with a different refractive index, which is used to supplement the mechanical strength of the glass frit.

Accordingly, in order to supplement the refractive index of the inner filler, the light transmission layer may have a refractive index ranging from about 1.75 to about 1.85.

It can be considered that the layer capable of supplementing the refractive index, that is, the light transmission layer, may be formed on the substrate on which the OLED is formed, not on the encapsulation substrate, the light transmission layer may be formed on the encapsulation substrate as described above, and thus the OLED may not be damaged, and the light transmission layer may be formed by various methods. In addition, when the layer capable of supplementing the refractive index is formed on the substrate where the OLED is to be formed, one more process will be added, and thus a processing time to form the substrate where the OLED will be formed is increased. However, when the layer is formed on the encapsulation layer, the process of forming the substrate where the OLED will be formed and the process of forming the encapsulation substrate are performed separately, and thus the processing time to form the substrate is not increased. In one embodiment, the light transmission layer may be formed on the encapsulation substrate.

Figure 6:
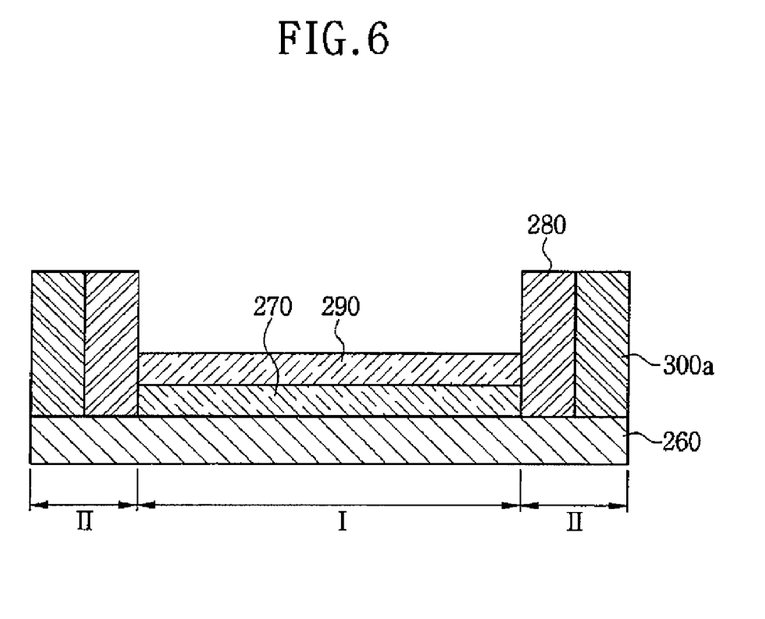

Subsequently, referring to FIG. 6, a glass frit 300a is formed outside the sealant portion formed on the encapsulation region II of the encapsulation substrate. The glass frit 300a may be formed by melting glass including one selected from the group consisting of lead oxide (PbO), diboron trioxide ($B_2O_3$) and silicon dioxide ($SiO_2$), and grinding it into powder. Alternatively, the glass frit 300a may be formed by screen printing or dispensing. The encapsulation substrate 260, the light transmission layer 270 and the inner filler 290 may together form an upper section (which may also include a sealant portion 280, the grass frit 300a and encapsulation agent 300b) of the OLED display device (See FIGS. 6 and 7).

Figure 7:
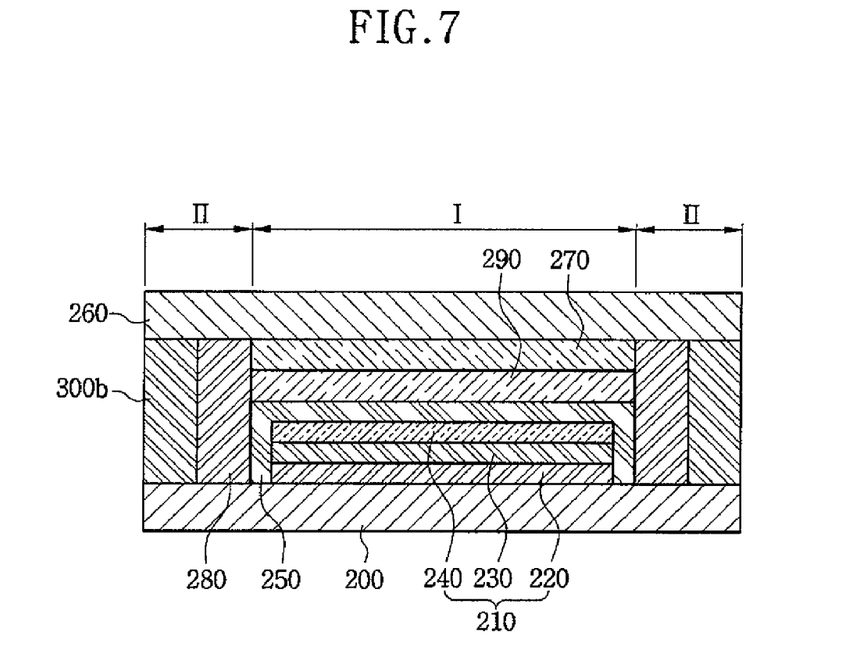

In one embodiment, referring to FIG. 7, the encapsulation substrate 260 is aligned with the substrate 200 formed, and laser is applied to the glass frit 300a to melt and solidify the glass frit 300a, thereby forming an encapsulation agent 300b.

As a result, the OLED display device according to the exemplary embodiment of the present invention is completed.

Figure 8:
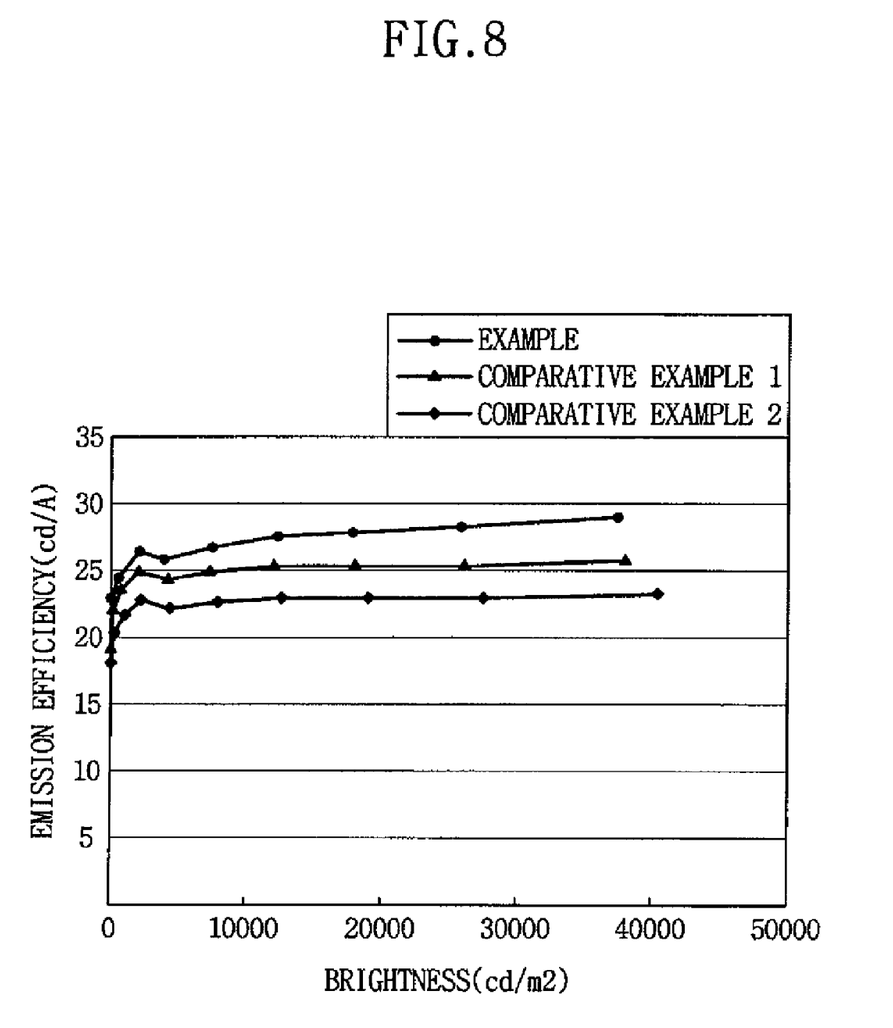
FIG. 8 is a graph showing emission efficiencies according to an example and comparative examples.

FIG. 8 is a graph showing emission efficiencies according to an example and comparative examples.

In the example, an OLED display device was formed by forming a light transmission layer having a thickness of 700 Å using silicon oxynitride on an encapsulation substrate, and a protection layer having a thickness of 700 Å using an organic material on a substrate. Here, the light transmission layer was formed to have a refractive index of 1.8. The substrate was encapsulated with the encapsulation substrate using a glass frit, and an inner filler was formed on the light transmission layer to supplement the strength of the glass frit.

In comparative example 1, a protection layer having a thickness of 700 Å was formed of an organic material on a substrate, and in comparative example 2, a protection layer having a thickness of 700 Å was formed of silicon oxynitride on a substrate.

That is, in comparative example 1, except that a light transmission layer is not formed on the encapsulation substrate, all processes were performed in the same manners as the example, and in comparative example 2, except that a light transmission layer is not formed on the encapsulation substrate, and the inorganic layer is formed on the substrate, all processes were performed in the same manners as the example.

Subsequently, referring to FIG. 8, in the example, the emission efficiency according to brightness is maintained at approximately 26.34 cd/A, which indicates that the emission efficiency is excellent.

However, in comparative example 1, the emission efficiency according to brightness is maintained at approximately 25.06 cd/A, and in comparative example 2, the emission efficiency according to brightness is maintained at approximately 22.87 cd/A, which indicate that the emission efficiency according to brightness is poor due to the inner filler formed between the substrate and the encapsulation substrate.

As described above, an OLED display device according to at least one embodiment of the present invention may have excellent resistance to penetration of moisture or oxygen due to the use of a glass frit as an encapsulation agent.

Moreover, the OLED display device can supplement the weak mechanical strength resulting from the glass frit as an encapsulation agent by forming the inner filler between the substrate and the encapsulation substrate, and can prevent a decrease in emission efficiency resulting from the use of the inner filler by forming the light transmission layer on the encapsulation substrate.

Consequently, an organic light emitting diode (OLED) display device having an excellent resistance to penetration of moisture or oxygen by bonding a substrate to an encapsulation substrate using a glass frit, and a method of fabricating the same may be provided.

An OLED display device capable of supplementing the mechanical strength of a grass frit, and a method of fabricating the same may be provided.

In addition, an OLED display device capable of supplementing the mechanical strength of a glass frit and preventing a decrease in emission efficiency according to brightness, and a method of fabricating the same may be provided.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device, comprising:
    a base substrate including a first device region and a first encapsulation region, wherein the first encapsulation region is located on opposing sides of the first device region;
    an organic light emitting diode (OLED) disposed on the first device region;
    an inner filler formed over the OLED and the first device region;
    a light transmission layer continuously formed on the inner filler;
    an encapsulation substrate including a second device region and a second encapsulation region corresponding to the first device region and first encapsulation region, respectively, wherein the second device region is formed over the light transmission layer; and
    an encapsulation agent disposed on the first and second encapsulation regions, and configured to encapsulate the base substrate with the encapsulation substrate,
    wherein the light transmission layer has a refractive index ranging from about 1.75 to about 1.85.

2. The device according to claim 1, further comprising:
    a protection layer formed between the OLED and inner filler and surrounding the OLED.

3. The device according to claim 1, further comprising:
    a sealant portion disposed on the first and second encapsulation regions, and configured to support the inner filler.

4. The device according to claim 3, wherein the encapsulation agent is disposed outside the sealant portion.

5. The device according to claim 1, wherein the encapsulation agent is a glass frit.

6. The device according to claim 5, wherein the glass frit includes one selected from the group consisting of lead oxide (PbO), diboron trioxide ($B_2O_3$) and silicon dioxide ($SiO_2$).

7. The device according to claim 1, wherein the light transmission layer is formed of an organic layer, an inorganic layer or a combination thereof.

8. The device according to claim 1, wherein the light transmission layer has a thickness ranging from about 630 Å to about 770 Å.

9. The device according to claim 1, wherein the inner filler includes at least one selected from the group consisting of acrylic resin, epoxy-based resin, fluorine resin and tefron resin.

10. The device according to claim 3, wherein the sealant portion includes at least one selected from the group consisting of silicon-based resin, epoxy-based resin, acrylic resin and polyimide-based resin.

11. The device according to claim 1, wherein the OLED further includes a thin film transistor having a semiconductor layer, a gate electrode and source and drain electrodes.

12. The device according to claim 1, wherein the inner filler comprises first and second surfaces opposing each other, wherein the first surface faces the OLED, and wherein the light transmission layer is formed on the substantially entire second surface of the inner filler.

* * * * *